United States Patent
Kim

(10) Patent No.: US 12,119,248 B2
(45) Date of Patent: Oct. 15, 2024

(54) MODULE TRAY FOR SEMICONDUCTOR DEVICE

(71) Applicant: Samsung Electronics Co., Ltd., Suwon-si (KR)

(72) Inventor: Taegeon Kim, Suwon-si (KR)

(73) Assignee: Samsung Electronics Co, Ltd., Gyeonggi-do (KR)

( * ) Notice: Subject to any disclaimer, the term of this patent is extended or adjusted under 35 U.S.C. 154(b) by 41 days.

(21) Appl. No.: 18/183,520

(22) Filed: Mar. 14, 2023

(65) Prior Publication Data

US 2024/0055286 A1  Feb. 15, 2024

(30) Foreign Application Priority Data

Aug. 10, 2022 (KR) .................. 10-2022-0099787

(51) Int. Cl.
*H01L 21/673* (2006.01)

(52) U.S. Cl.
CPC .............. *H01L 21/67333* (2013.01)

(58) Field of Classification Search
CPC .................................. H01L 21/6733
USPC .................. 206/710, 454, 485, 561, 565
See application file for complete search history.

(56) References Cited

U.S. PATENT DOCUMENTS

| | | | | |
|---|---|---|---|---|
| 6,082,547 A * | 7/2000 | Nentl | ............... | H01L 21/67333 206/724 |
| 8,009,800 B2 | 8/2011 | Doyle et al. | | |
| 8,496,113 B2 * | 7/2013 | Na | .................. | G01R 31/2893 206/722 |
| 2009/0236260 A1 * | 9/2009 | Lee | ................... | H01L 21/67333 206/594 |
| 2012/0043253 A1 * | 2/2012 | Jeong | ................ | H01L 21/67333 206/710 |
| 2015/0187622 A1 * | 7/2015 | Johnson | ................. | H01L 21/68 438/464 |

FOREIGN PATENT DOCUMENTS

| | | |
|---|---|---|
| CN | 107284853 A | 10/2017 |
| KR | 1998-0029937 A | 7/1998 |
| KR | 100388479 B1 | 6/2003 |
| KR | 102317592 B1 | 10/2021 |
| KR | 102351343 B1 | 1/2022 |

* cited by examiner

*Primary Examiner* — Jacob K Ackun

(74) *Attorney, Agent, or Firm* — Harness, Dickey & Pierce, P.L.C.

(57) ABSTRACT

A module tray for a semiconductor device includes a case and an insert block. The case includes a base plate, first and second sidewalls extending from opposite sides of the base plate in a vertical direction to define an accommodation space, and first and second fastening grooves respectively formed in inner surfaces of the first and second sidewalls. The first and second fastening grooves have upper ends opened to upper surfaces of the first and second sidewalls, respectively. The insert block has a substrate accommodating space for accommodating a semiconductor substrate. The insert block is detachably inserted into the first and second fastening grooves of the case. The insert block has first and second fastening joints extending in the vertical direction such that the first and second fastening joint are respectively inserted through the upper ends of the first and second fastening grooves.

20 Claims, 12 Drawing Sheets

MODULE TRAY FOR SEMICONDUCTOR DEVICE

PRIORITY STATEMENT

This application claims priority under 35 U.S.C. § 119 to Korean Patent Application No. 10-2022-0099787, filed on Aug. 10, 2022 in the Korean Intellectual Property Office (KIPO), the contents of which are herein incorporated by reference in their entirety.

BACKGROUND

1. Field

Example embodiments relate to a module tray for a semiconductor device. More particularly, example embodiments relate to a module tray for a semiconductor device for accommodating a plurality of semiconductor substrates.

2. Description of the Related Art

A module tray may be used to store and transport a plurality of semiconductor substrates. Since an inner space of the module tray is relatively narrow, it may happen that the semiconductor substrate is not inserted into a desired (or alternatively, preset) slot while a worker inserts the semiconductor substrate into the slot inside the module tray. When the semiconductor substrate is inserted into a slot other than the desired (or alternatively, preset) slot the semiconductor substrate may be damaged.

SUMMARY

Example embodiments provide a module tray for a semiconductor device capable of safely and easily accommodating a semiconductor substrate in a desired (or alternatively, predetermined) position.

According to some example embodiments, a module tray for a semiconductor device includes a case and an insert block. The case includes a base plate, first and second sidewalls extending from opposite sides of the base plate in a vertical direction to define an accommodation space, and first and second fastening grooves respectively formed in inner surfaces of the first and second sidewalls and extending in the vertical direction. The first and second fastening grooves have upper ends opened to upper surfaces of the first and second sidewalls, respectively. The insert block has a substrate accommodating space for accommodating a semiconductor substrate. The insert block is detachably inserted into the first and second fastening grooves of the case. The insert block has first and second fastening joints extending in the vertical direction such that the first and second fastening joint are respectively inserted through the upper ends of the first and second fastening grooves.

According to some example embodiments, a module tray for a semiconductor device includes a case and an insert block. The case includes a base plate, first and second sidewalls, a plurality of first fastening grooves, and a plurality of second fastening grooves. The first and second sidewalls face each other in a first horizontal direction on the base plate and defining an accommodation space. The plurality of first fastening grooves space apart from each other in a second horizontal direction orthogonal to the first horizontal direction on an inner surface of the first sidewall and respectively having first upper ends opened in a vertical direction. The plurality of second fastening grooves space apart from each other in the second horizontal direction on an inner surface of the second side wall and respectively having opened second upper ends. The insert block configures to accommodate a semiconductor substrate that is inserted therein. The insert block has first and second fastening joints that have shapes corresponding to the first and second fastening grooves such that the first and second fastening joints are respectively inserted into and engaged with the first and second fastening grooves in the vertical direction.

According to some example embodiments, a module tray for a semiconductor device includes a case and an insert block. The case has a base plate, first and second sidewalls, and first and second fastening grooves. The first and second sidewalls extend in a vertical direction from opposite sides of the base plate to define an accommodation space. The first and second fastening grooves are formed to respectively extend in the vertical direction on inner surfaces of the first and second sidewalls. The first and second fastening grooves have upper ends respectively opened to upper surfaces of the first and second sidewalls. The insert block has a substrate accommodating space for accommodating a semiconductor substrate. The insert block is detachably inserted into the first and second fastening grooves of the case. The insert block has first and second fastening joints extending in the vertical direction such that the first and second fastening joint are respectively inserted through the upper ends of the first and second fastening grooves. The insert block has a plurality of holders, each of the plurality of block holders respectively extending in the vertical direction from one of the first and second fastening joints and a pair of side protrusions configured to press and fix the semiconductor substrate inserted and accommodated into the substrate accommodating space.

Thus, the semiconductor substrate may be accommodated in the case while being inserted into the insert block. Because the first and second fastening joints of the insert block are respectively inserted into and coupled to the first and second fastening grooves of the case, the insert block may be disposed at a desired (or alternatively, predetermined) position inside the case. Because the semiconductor substrate is accommodated in the insert block, it is possible to prevent or hinder the semiconductor substrate from being inserted into a wrong position inside the case. In addition, because the semiconductor substrate is doubly protected by the insert block and the case, the semiconductor substrate can be more stably protected and managed.

BRIEF DESCRIPTION OF THE DRAWINGS

Example embodiments will be more clearly understood from the following detailed description taken in conjunction with the accompanying drawings.

FIG. 1 is a perspective view illustrating a module tray for a semiconductor device in accordance with some example embodiments.

FIG. 2 is a plan view illustrating the module tray for a semiconductor device in FIG. 1.

FIG. 3 is a cross-sectional view taken along the line A-A' in FIG. 1.

FIG. 4 is an enlarged cross-sectional view illustrating portion 'B' in FIG. 1.

FIG. 5 is a perspective view illustrating an insert block into which a semiconductor substrate is inserted.

FIG. 6 is a plan view illustrating an insert the block inserted fixedly into a case.

FIG. 7 is an enlarged cross-sectional view illustrating portion 'C' in FIG. 6.

FIGS. 8 to 10 are front views illustrating processes in which a case and an insert block are separated and coupled.

FIGS. 11 to 12 are plan views illustrating processes in which a case and an insert block are separated and coupled.

DETAILED DESCRIPTION OF EXAMPLE EMBODIMENTS

Hereinafter, some example embodiments will be explained in detail with reference to the accompanying drawings.

Figure 1:
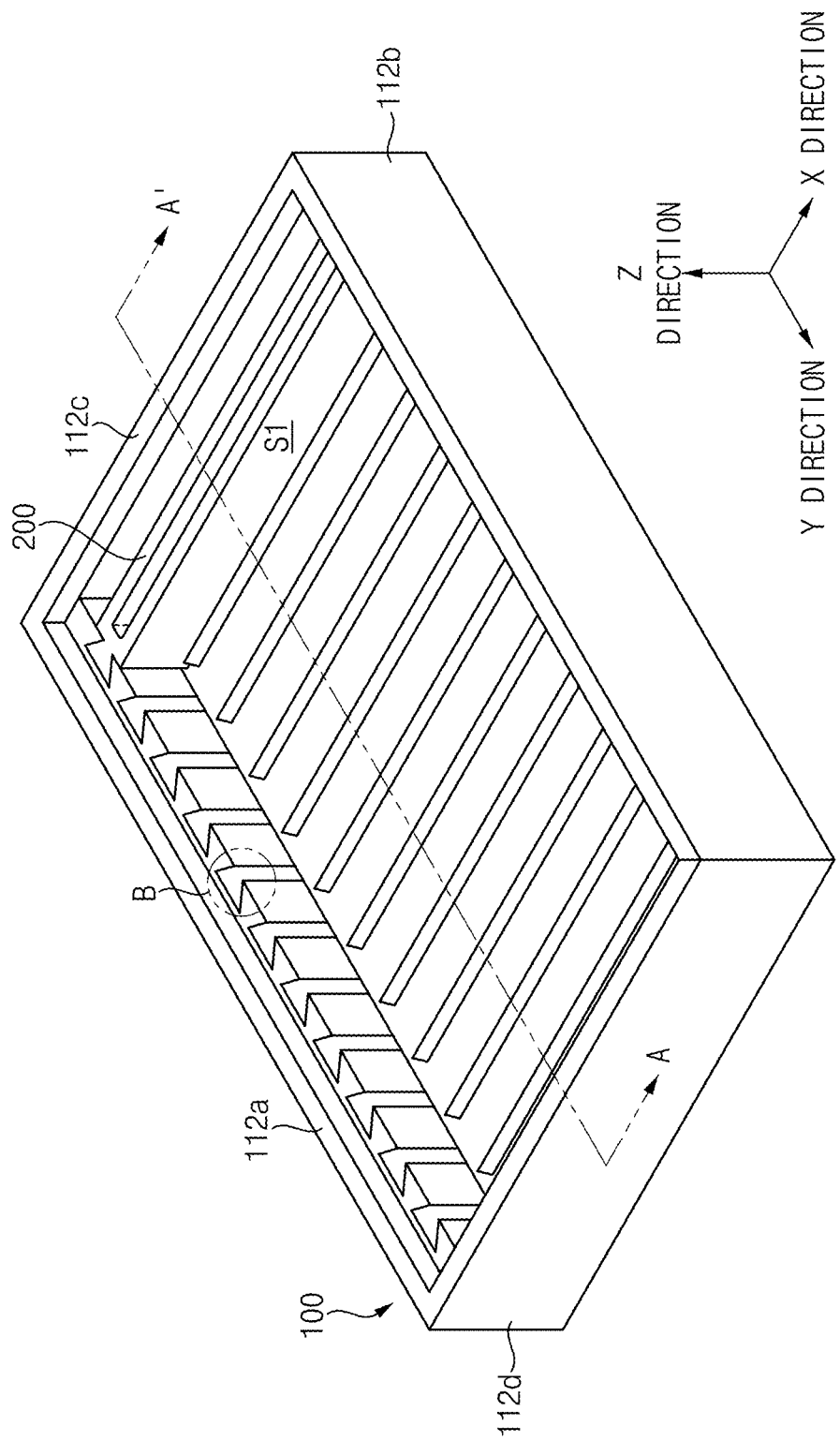
FIGS. 1 to 12 represent non-limiting, example embodiments as described herein.
Figure 2:
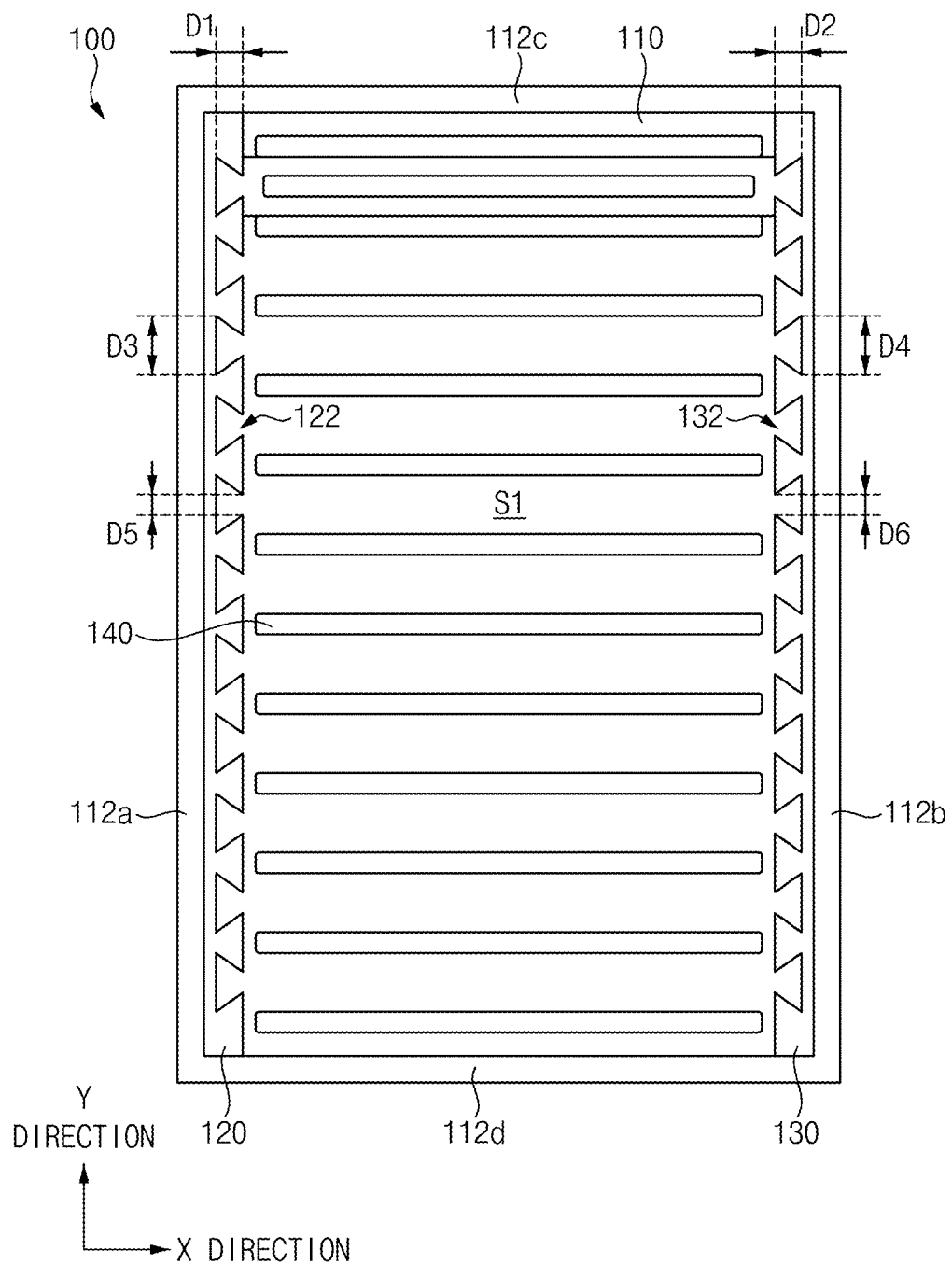
Figure 3:
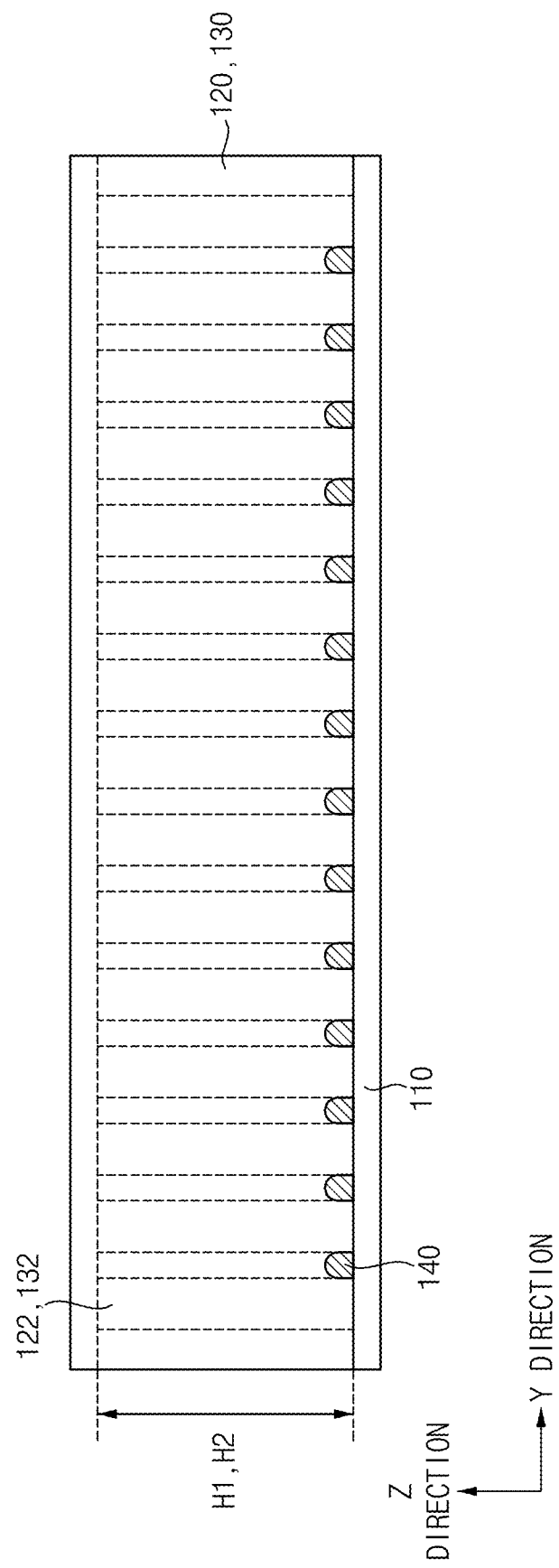
Figure 4:
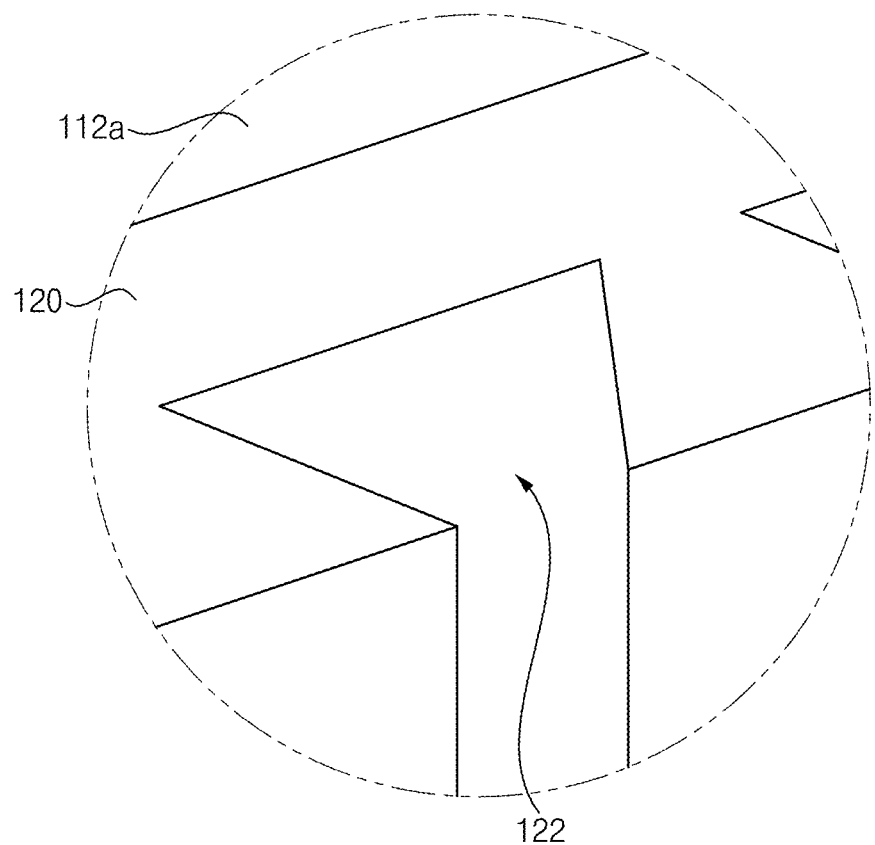
Figure 5:
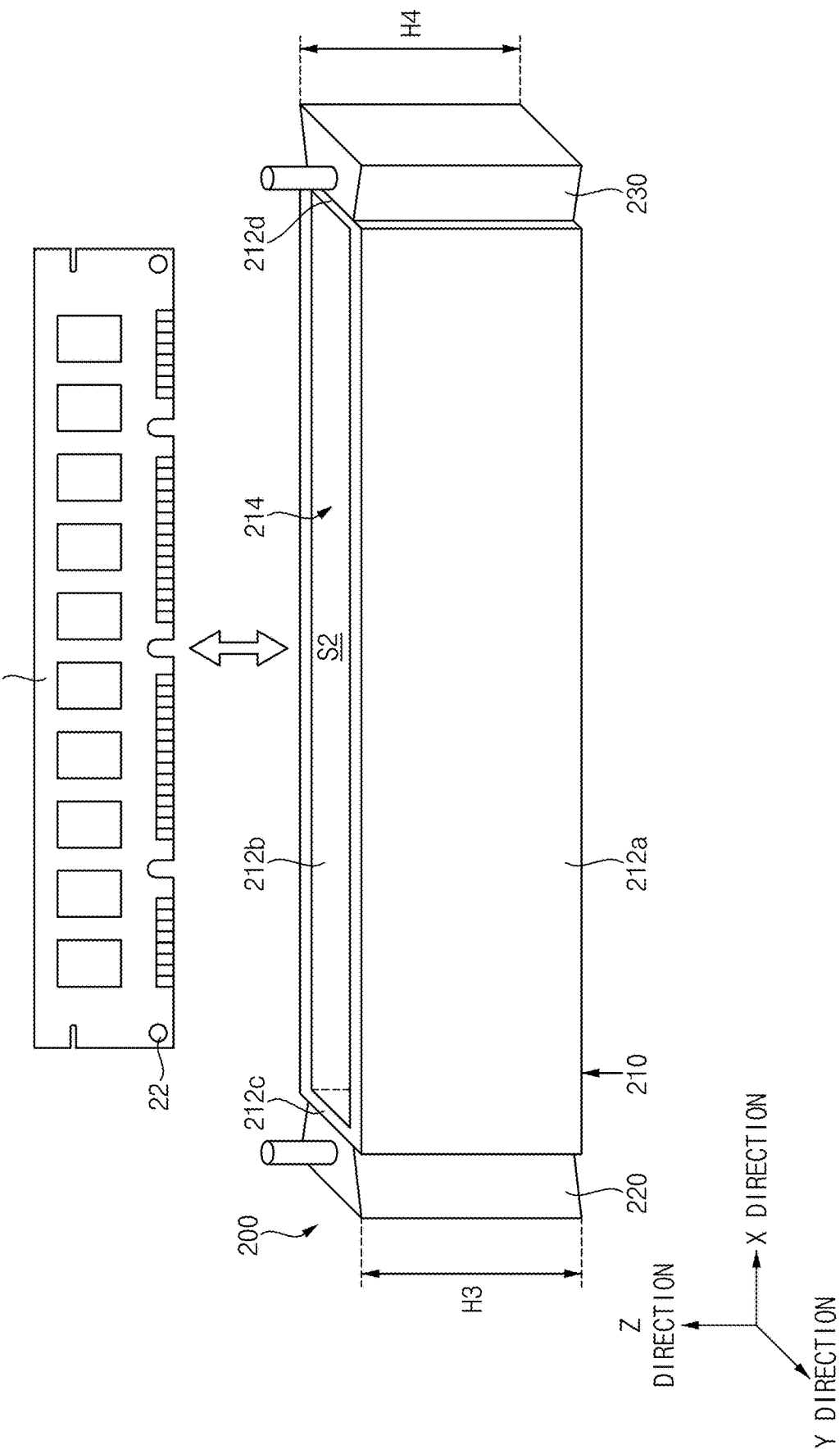
Figure 6:
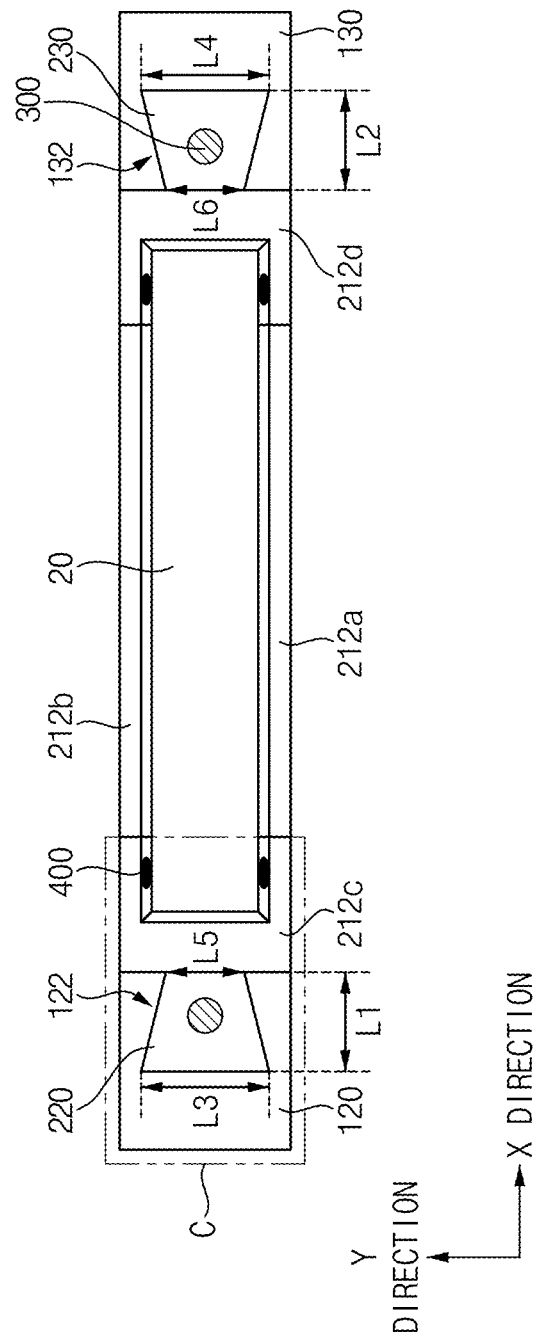
Figure 7:
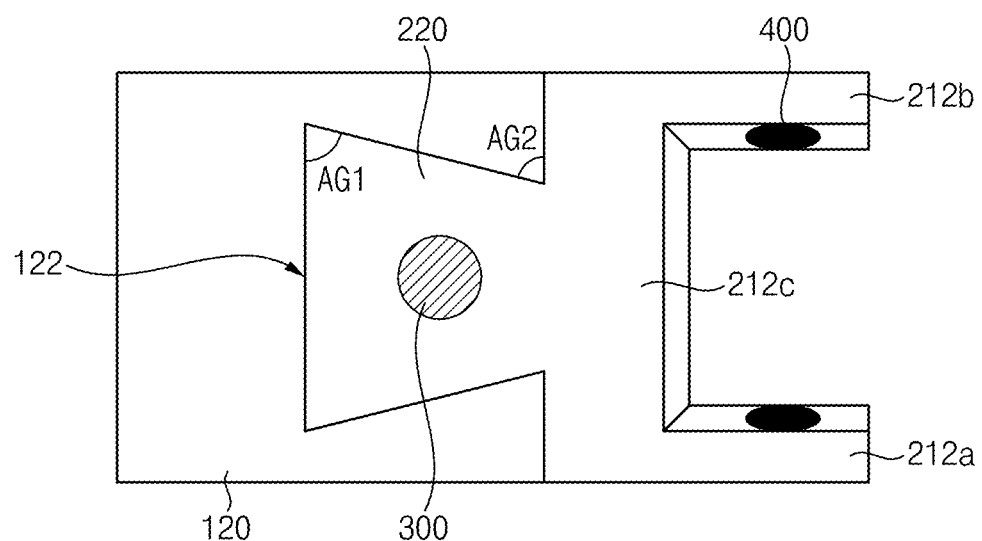

FIG. 1 is a perspective view illustrating a module tray for a semiconductor device in accordance with some example embodiments. FIG. 2 is a plan view illustrating the module tray for a semiconductor device in FIG. 1. FIG. 3 is a cross-sectional view taken along the line A-A' in FIG. 1. FIG. 4 is an enlarged cross-sectional view illustrating portion 'B' in FIG. 1. FIG. 5 is a perspective view illustrating an insert block into which a semiconductor substrate is inserted. FIG. 6 is a plan view illustrating the insert block inserted fixedly into a case. FIG. 7 is an enlarged cross-sectional view illustrating portion 'C' in FIG. 6.

Referring to FIGS. 1 to 7, a module tray 10 for a semiconductor device may include a case 100, and an insert block 200 that is accommodated in the case 100 and support fixedly the semiconductor device therein.

In some example embodiments, the module tray 10 for the semiconductor device may be a device configured to stably fix, store, and transport the semiconductor device therein. The module tray 10 for the semiconductor device may protect the semiconductor device from external impact. The module tray 10 for the semiconductor device may provide a space for accommodating and transporting a plurality of the semiconductor devices.

The semiconductor device accommodated in the module tray 10 may include a semiconductor substrate 20. The semiconductor substrate 20 may be a printed circuit board (PCB) and a substrate on which a semiconductor package manufacturing process is performed. The printed circuit board may be a multilayer circuit board having vias and various circuits therein. The semiconductor substrate 20 may include a dynamic random access memory (DRAM). For example, the semiconductor substrate 20 may include DDR3, DDR4, DDR5, low power double data rate (LPDDR), or the like. The module tray 10 may serve as a carrier that loads a plurality of the semiconductor substrates 20 therein for the semiconductor package manufacturing process.

In some example embodiments, the case 100 may be a box body having an overall rectangular parallelepiped shape with an open upper surface. The case 100 may include a base plate 110 defining an internal space S1, first and second sidewalls 112a and 112b facing each other on opposite sides (e.g., opposite ends) of the base plate 110, and third and fourth sidewalls 112c, 112d extending between the first and second sidewalls 112a, 112b on opposite sides (e.g., opposite ends) of the base plate 110. The case 100 may have an upper surface opening 114. The case 100 may accommodate the insert block 200 in the internal space S1. The case 100 may include first and second fastening portions 120, 130 for fixing the insert block 200 therein.

The base plate 110 of the case 100 may extend parallel (or substantially parallel) to the ground, and the first and second sidewalls 112a, 112b may extend parallel (or substantially parallel) to each other. The third and fourth sidewalls 112c, 112d may extend parallel (or substantially parallel) to each other.

The base plate 110 and the first to fourth sidewalls 112a, 112b, 112c, 112d of the case 100 may include the same material. For example, the case 100 may include a metal material such as stainless steel (Fe). Alternatively, the case 100 may include a plastic material. For example, the plastic material may include polyethylene (PE), polypropylene (PP), polystyrene (PS), polyethylene terephthalate (PET), polyamides (PA), polyester (polyester, PES), polyvinyl chloride (PVC), polyurethane (polyurethanes, PU), polycarbonate (PC), polyvinylidene chloride (PVDC), and the like.

The case 100 may include the plastic material or the metal material having high hardness and high toughness. When the insert block 200 in which the semiconductor substrate 20 is inserted is accommodated in the case 100, the case 100 may protect the insert block 200 and the semiconductor substrate 20 accommodated therein from the external impact. The case 100 may be individually stored and managed in a state in which the insert block 200 is not accommodated. Since the case 100 has a rectangular parallelepiped structure, a plurality of the cases may be stored in a stacked state.

For example, a distance between the upper surface opening 114 and the base plate 110 may be within a range of 400 mm to 600 mm A distance between the first sidewall 112a and the second sidewall 112b may be within a range of 150 mm to 250 mm A distance between the third sidewall 112c and the fourth sidewall 112d may be within a range of 250 mm to 350 mm.

In some example embodiments, the case 100 may include the first and second fastening portions 120, 130 for fixing the insert block 200 accommodated therein. The first fastening portion 120 may extend along an inner surface of the first sidewall 112a. The second fastening portion 130 may extend along an inner surface of the second sidewall 112b. The first fastening portion 120 may include a plurality of first fastening grooves 122 into which the insert blocks 200 are inserted and fixed respectively. The second fastening portion 130 may include a plurality of second fastening grooves 132 into which the insert blocks 200 are inserted and fixed respectively.

A plurality of first fastening grooves 122 may be arranged to be spaced apart from each other in a second horizontal direction (Y direction) on an inner surface of the first fastening portion 120. The first fastening groove 122 may extend in a vertical direction (Z direction) orthogonal to the second horizontal direction from the inner surface of the first fastening portion 120. The first fastening groove 122 may extend from the upper surface opening 114 to the base plate 110.

The first fastening groove 122 may be defined by supports that protrude from the inner surface of the first fastening portion 120 by a desired (or alternatively, predetermined) first length D1 in a first horizontal direction (X direction) orthogonal to the second horizontal direction. For example, the first fastening groove 122 may have an isosceles trapezium shape when viewed from a plan view. A bottom side of the isosceles trapezium shape of the first fastening groove 122 may have a third length D3. A top side of the isosceles trapezium shape of the first fastening groove 122 may have a fifth length D5 at a position open to the internal space S1.

A plurality of second fastening grooves 132 may be arranged to be spaced apart from each other in the second horizontal direction (Y direction) on an inner surface of the second fastening portion 130. The second fastening groove 132 may extend from the inner surface of the second fastening portion 130 in the vertical direction (Z direction) orthogonal to the second vertical direction. The second fastening groove 132 may extend from the upper surface opening 114 to the base plate 110.

The second fastening groove 132 may be defined by supports that protrude from the inner surface of the second fastening portion 130 by a desired (or alternatively, predetermined) second length D2 in the first horizontal direction (X direction) orthogonal to the second horizontal direction. For example, the second fastening groove 132 may have the isosceles trapezium shape when viewed from the plan view. A bottom side of the isosceles trapezium shape of the second fastening groove 132 may have a fourth length D4. A top side of the isosceles trapezium shape of the second fastening groove 132 may have a sixth length D6 at a position open to the internal space S1.

In this specification, the direction (X direction) between the first sidewall 112a and the second sidewall 112b may be referred to as the first horizontal direction, and the direction (Y direction) between the third sidewall 112c and the fourth sidewall 112d may be referred to as the second horizontal direction, and the direction orthogonal to the first and second horizontal directions may be referred to as the vertical direction (Z direction). For example, the number of the first fastening grooves 122 provided in the first fastening portion 120 may be identical to the number of the second fastening grooves 132 provided in the second fastening portion 130, as illustrated in FIG. 2, the first fastening groove 122 and the second fastening groove 132 facing each other may support both ends of one insert block 200. For example, the number of the first fastening grooves 122 and the second fastening grooves 132 may be within a range of 20 to 80. The first and second fastening grooves 122 and 132 may include the plastic material or the metal material.

The first length D1 of the first fastening groove 122 and the second length D2 of the corresponding second fastening groove 132 may be the same. The first length D1 of the first fastening groove 122 and the second length D2 of the corresponding second fastening groove 132 may be within a range of 4 mm to 6 mm. In some example embodiments, the first length D1 of the first fastening groove 122 and the second length D2 of the corresponding second fastening groove 132 may be within a range of 4.5 mm to 5.5 mm.

The third length D3 of the first fastening groove 122 and the fourth length D4 of the corresponding second fastening groove 132 may be the same. The third length D3 of the first fastening groove 122 and the fourth length D4 of the corresponding second fastening groove 132 may be within a range of 4 mm to 6 mm. In some example embodiments, the third length D3 of the first fastening groove 122 and the fourth length D4 of the corresponding second fastening groove 132 may be within a range of 4.5 mm to 5.5 mm.

The fifth length D5 of the first fastening groove 122 and the sixth length D6 of the corresponding second fastening groove 132 may be the same in a position opened to the internal space S1. The fifth length D5 of the first fastening groove 122 and the sixth length D6 of the corresponding second fastening groove 132 may be within a range of 3 mm to 6 mm.

A height H1 of the first fastening groove 122 in the vertical direction (Z direction) and a height H2 of the corresponding second fastening groove 132 in the vertical direction (Z direction) may be the same. The height H1 in the vertical direction (Z direction) of the first fastening groove 122 and the height H2 in the vertical direction (Z direction) of the corresponding second fastening groove 132 may be within a range of 40 mm to 200 mm.

A base angle of the isosceles trapezium shape of the first fastening groove 122 and a base angle of the isosceles trapezium shape of the corresponding second fastening groove 132 may be the same. The base angle of the isosceles trapezium shape of the first fastening groove 122 and the base angle of the isosceles trapezium shape of the corresponding second fastening groove 132 may be within a range of 45 degrees to 80 degrees. In another example, the base angle of the isosceles trapezium shape of the corresponding second fastening groove 132 may be within a range of 55 degrees to 70 degrees In some example embodiments, the case 100 may further include a plurality of insert block support guides 140 that protrude from the base plate 110. The insert block 200 may be arranged or located between a pair of the insert block support guides 140 adjacent to each other. The insert block 200 may be supported fixedly inside the case 100 by the first and second fastening grooves 122, 132 and the insert block support guides 140.

The insert block support guides 140 may be spaced apart from each other in the second horizontal direction (Y direction) on the base plate 110. The insert block support guide 140 may extend in the first horizontal direction (X direction). The insert block support guide 140 may extend from the first fastening portion 120 to the second fastening portion 130. The insert block support guide 140 may be provided between the first and second fastening grooves 122, 132 corresponding to each other. For example, the insert block support guides 140 may include a plastic material or a metal material.

In some example embodiments, the insert block 200 may be a box body having an overall rectangular parallelepiped shape with an open upper surface. The insert block 200 may include a bottom plate 210, a front plate 212a and a rear plate 212b facing each other, and first and second side plates 212c, 212d facing each other. The bottom plate 210, the front plate 212a, the rear plate 212b, and first and second side plates 212c, 212d may define a substrate accommodating space S2. The insert block 200 may have an opening 214. The insert block 200 may accommodate a semiconductor substrate 20 inserted in the vertical direction (Z direction) in the substrate accommodating space S2. For example, the semiconductor substrate 20 may be accommodated in the case 100 by aligning a longitudinal direction of the semiconductor substrate 20 in the first horizontal direction between the first and second sidewalls 112a, 112b.

The bottom plate 210 of the insert block 200 may extend parallel (or substantially parallel) to the ground, and the front plate and the rear plate 212b may extend parallel (or substantially parallel) to each other. The first and second side plates 212c and 212d may extend parallel (or substantially parallel) to each other. The semiconductor substrate 20 may be inserted between the first and second side plates 212c, 212d to be accommodated in the insert block 200. For example, the bottom plate 210, the front plate 212a, the rear plate 212b, and the first and second side plates 212c, 212d of the insert block 200 may include the same plastic material or metal material.

The insert block 200 may accommodate the semiconductor substrate 20 therein to protect the semiconductor substrate 20 from the external impact. The insert block 200 may be individually stored and managed in a state in which the semiconductor substrate 20 is not accommodated. Since the insert block 200 has a rectangular parallelepiped structure, a plurality of the insert blocks may be stored in a stacked state.

For example, a distance between the opening 214 and the bottom plate 210 may be within a range of 40 mm to 80 mm A distance between the first side plate 212*c* and the second side plate 212*d* may be within a range of 120 mm to 150 mm A distance between the front plate 212*a* and the rear plate 212*b* may be within a range of 7 mm to 10 mm.

In some example embodiments, the insert block 200 may include a first fastening joint 220 provided on the first side plate 212*c* and a second fastening joint 230 provided on the second side plate 212*d*. When the insert block 200 in supported fixedly inside the case 100, the first and second fastening joints 220, 230 of the insert block 200 may be respectively positioned to be inserted into the first and second fastening grooves 122, 132 of the case 100 in the vertical direction (Z direction). The first and second fastening joints 220, 230 may secure fixedly the insert block 200 inside the case 100.

The first fastening joint 220 may be provided on an outer surface of the first side plate 212*c*. The first fastening joint 220 may extend in the vertical direction (Z direction). The first fastening joint 220 may extend from the opening 214 to the bottom plate 210. The first fastening joint 220 may be formed to protrude from the outer surface of the first side plate 212*c* by a desired (or alternatively, predetermined) first width L1 in the first horizontal direction (X direction). The protruding first width L1 of the first fastening joint 220 may be the same as the desired (or alternatively, predetermined) first length D1 of the first fastening groove 122.

For example, the first fastening joint 220 may have the isosceles trapezium shape when viewed in the plan view. A bottom side of the isosceles trapezium shape of the first fastening joint 220 may have a third width L3. A top side of the isosceles trapezium shape of the first fastening joint 220 may have a fifth width L5 at a position in contact with the first side plate 212*c*.

The second fastening joint 230 may be provided on an outer surface of the second side plate 212*d*. The second fastening joint 230 may extend in the vertical direction (Z direction). The second fastening joint 230 may extend from the opening 214 to the bottom plate 210. The second fastening joint 230 may be formed to protrude from the outer surface of the second side plate 212*d* by a desired (or alternatively, predetermined) second width L2 in the first horizontal direction (X direction). The protruding second width L2 of the second fastening joint 230 may be the same as the desired (or alternatively, predetermined) second length D2 of the second fastening groove 132.

For example, the second fastening joint 230 may have the isosceles trapezium shape when viewed in the plan view. A bottom side of the isosceles trapezium shape of the second fastening joint 230 may have a fourth width L4. A top side of the isosceles trapezium shape of the second fastening joint 230 may have a sixth width L6 at a position in contact with the second side plate 212*d*.

The protruding first width L1 of the first fastening joint 220 and the protruding second width L2 of the corresponding second fastening joint 230 may be equal to each other. The protruding first width L1 of the first fastening joint 220 and the protruding second width L2 of the corresponding second fastening joint 230 may be within a range of 4 mm to 6 mm. In some example embodiments, the protruding first width L1 of the first fastening joint 220 and the protruding second width L2 of the corresponding second fastening joint 230 may be within a range of 4.5 mm to 5.5 mm.

The third width L3 of the first fastening joint 220 and the fourth width L4 of the corresponding second fastening joint 230 may be equal to each other. The third width L3 of the first fastening joint 220 and the fourth width L4 of the corresponding second fastening joint 230 may be within a range of 4 mm to 6 mm. In some example embodiments, the third width L3 of the first fastening joint 220 and the fourth width L4 of the corresponding second fastening joint 230 may be within a range of 4.5 mm to 5.5 mm.

The fifth width L5 at a position where the first fastening joint 220 is connected to the first side plate 212*c* and the sixth width L6 at a position where the corresponding second fastening joint 230 is connected to the second side plate 212*d* may be equal to each other. The fifth width L5 at the position where the first fastening joint 220 is connected to the first side plate 212*c* and the sixth width L6 at the position where the corresponding second fastening joint 230 is connected to the second side plate 212*d* may be within a range of 3 mm to 6 mm.

A height H3 in the vertical direction (Z direction) of the first fastening joint 220 and a height H4 in the vertical direction (Z direction) of the corresponding second fastening joint 230 may be the same. The height H3 in the vertical direction (Z direction) of the first fastening joint 220 and the height H4 in the vertical direction (Z direction) of the corresponding second fastening joint 230 may be within a range of 40 mm to 200 mm.

For example, the first and second fastening joints 220, 230 may include a plastic material or a metal material.

In some example embodiments, the first and second fastening joints 220, 230 may include a counter angled structure (the isosceles trapezium shape) opposite to the first and second fastening grooves 122, 132. The isosceles trapezium shape of each of the first and second fastening joints 220, 230 may have the same base angle AG1. The isosceles trapezium shape of each of the first and second fastening grooves 122, 132 may have an alternate angle AG2 equal to the base angle AG1 of each of the first and second fastening joints 220, 230 respectively.

The first and second fastening joints 220, 230 may be more strongly fixed to the first and second fastening grooves 122, 132 through the counter angled structure. For example, the alternate angle AG2 of the counter angle structure may be within a range of 45 degrees to 80 degrees. In another example, the counter angle structure may be within the range of 55 degrees to 70 degrees.

In some example embodiments, the insert block 200 may further include a plurality of holders 300 configured to transmit an external force for inserting or separating the first and second fastening joints 220, 230 into/from the first and second fastening grooves 122, 132.

The holders 300 may be respectively provided on the first and second fastening joints 220, 230. When an operator or robot grips may grip the holders 300 and apply the external force in the vertical direction (Z direction), the insert block 200 may be withdrawn or coupled from the case 100. The first and second fastening joints 220, 230 may be withdrawn or coupled from or with the first and second fastening grooves 122, 132 by the external force. For example, the holders 300 may include a hook shape, a curved shape, etc. suitable for efficiently transmitting the external force.

In some example embodiments, the insert block 200 may further include a plurality of side protrusions 400 that provided on an inner sider surface thereof to make contact with the semiconductor substrate 20. The pair of side protrusions 400 may press to each other in the thickness direction (Y direction) and secure fixedly the semiconductor substrate 20 inserted into the inner surface of the insert block 200.

The side protrusions 400 may include an elastic material for elastically supporting the semiconductor substrate 20 by being compressed by the inserted semiconductor substrate 20. For example, the elastic material may include an elastomer, silicone, rubber, a spring, and the like.

In some example embodiments, the semiconductor substrate 20 may include a pair of grooves 22 corresponding to the pair of side protrusions 400. For example, the groove 22 may include an opening, a concave shape, or the like. When the semiconductor substrate 20 is completely inserted into the insert block 200, the side protrusions 400 may be engaged with the grooves 22 of the semiconductor substrate 20 to more securely fix the semiconductor substrate 20.

For example, the side protrusion 400 may include an arcuate shape such that the semiconductor substrate 20 may be smoothly mounted and detached from the insert block 200. The side protrusion 400 may be provided at a position spaced apart from the bottom plate 210 of the insert block 200.

The side protrusions 400 may support a lower surface of the semiconductor substrate 20 while the semiconductor substrate 20 is inserted into the insert block 200. The external force applied on the semiconductor substrate 20 may be transmitted to the lower surface of the semiconductor substrate 20. The lower surface of the semiconductor substrate 20 may transmit the external force to the side protrusions 400. The insert block 200 in which the semiconductor substrate 20 is accommodated may be inserted into the case 100 by the external force. The first and second fastening joints 220, 230 of the insert block 200 may be respectively inserted into the first and second fastening grooves 122, 132 by the external force.

Hereinafter, a method of accommodating the semiconductor substrate in the module tray for the semiconductor device in FIG. 1 will be explained.

Figure 8:
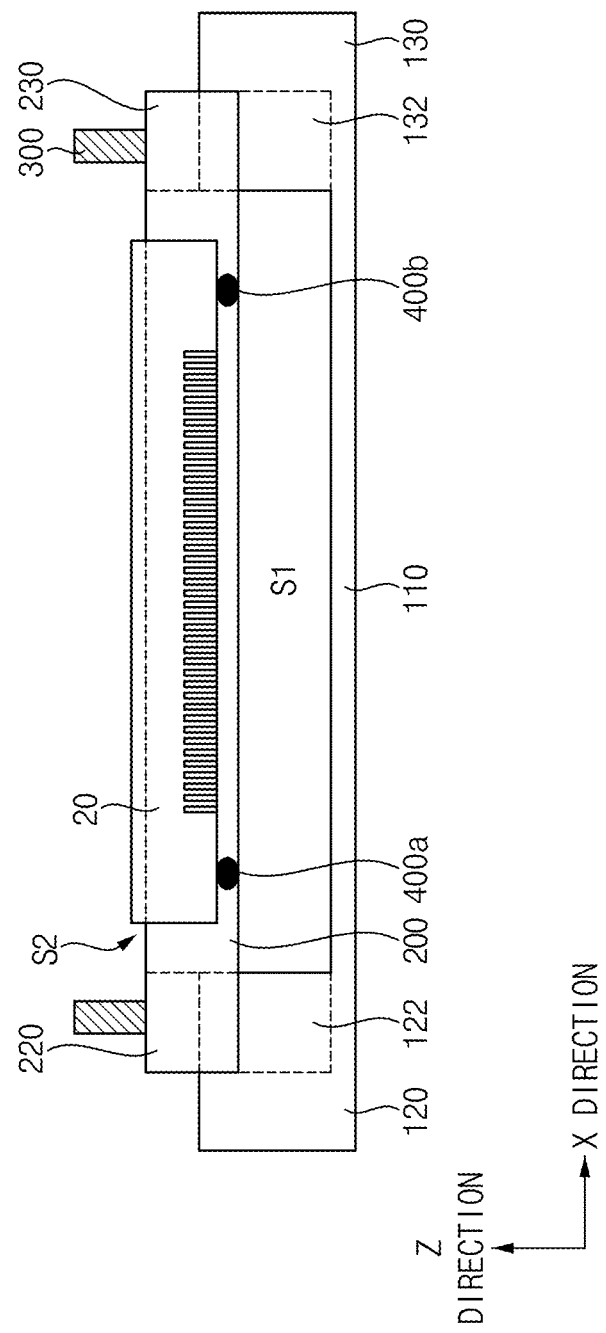
Figure 9:
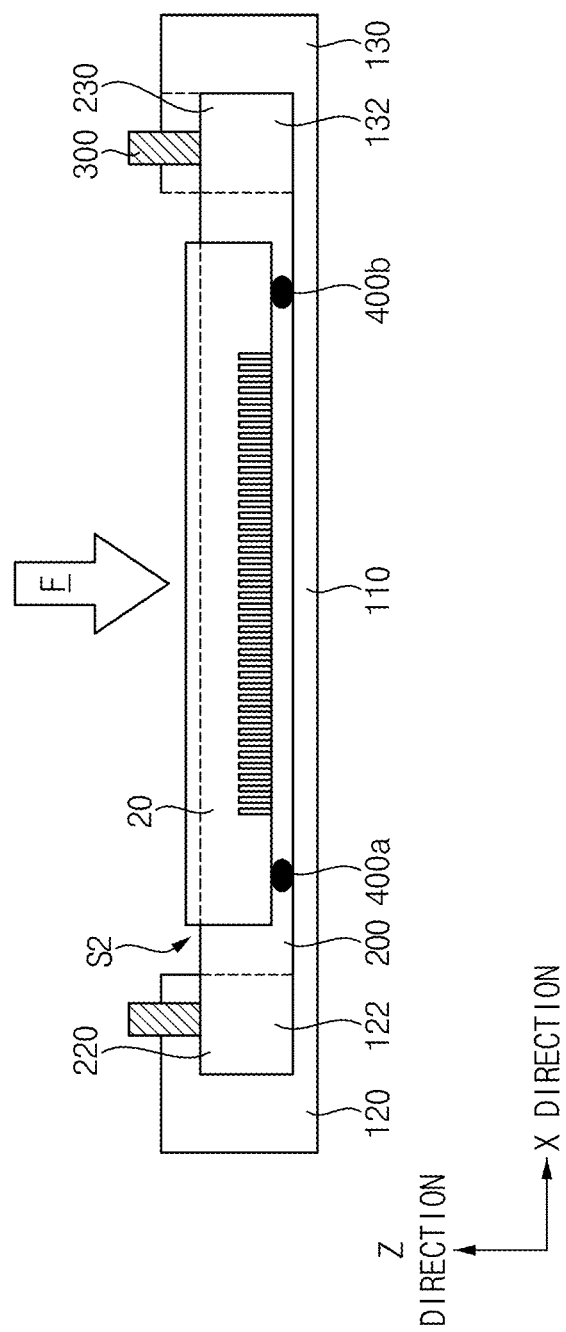
Figure 10:
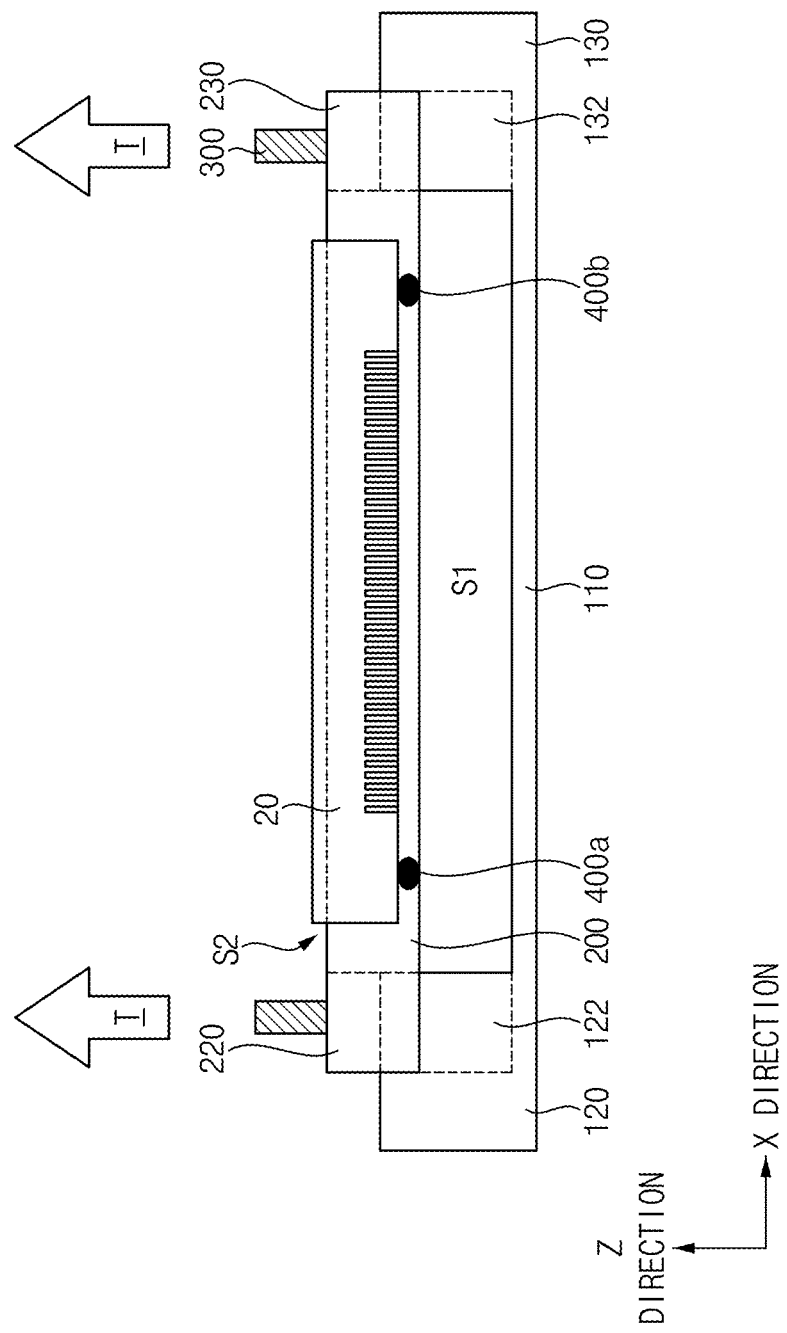
Figure 11:
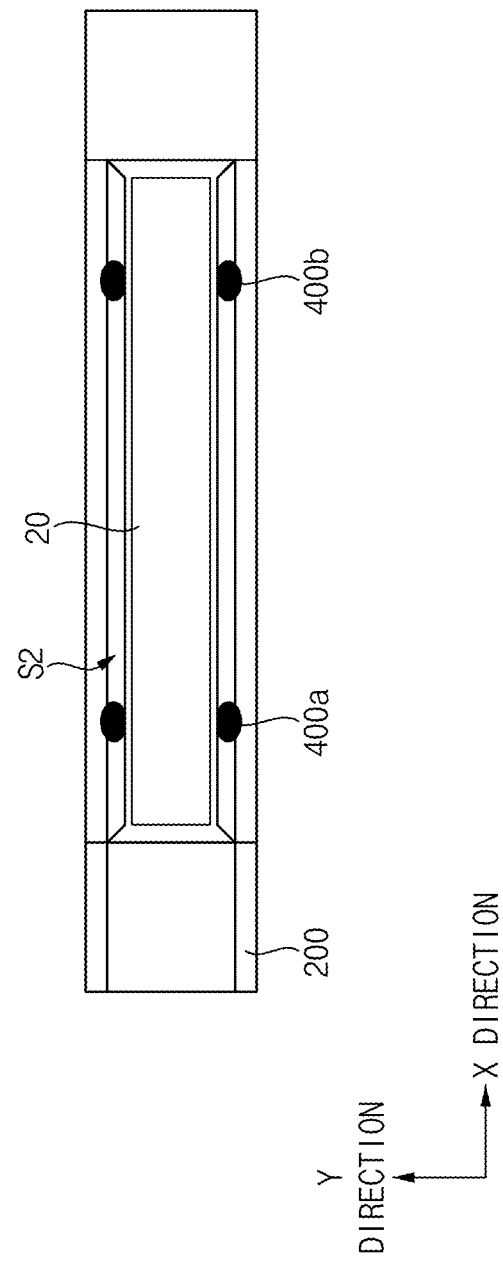
Figure 12:
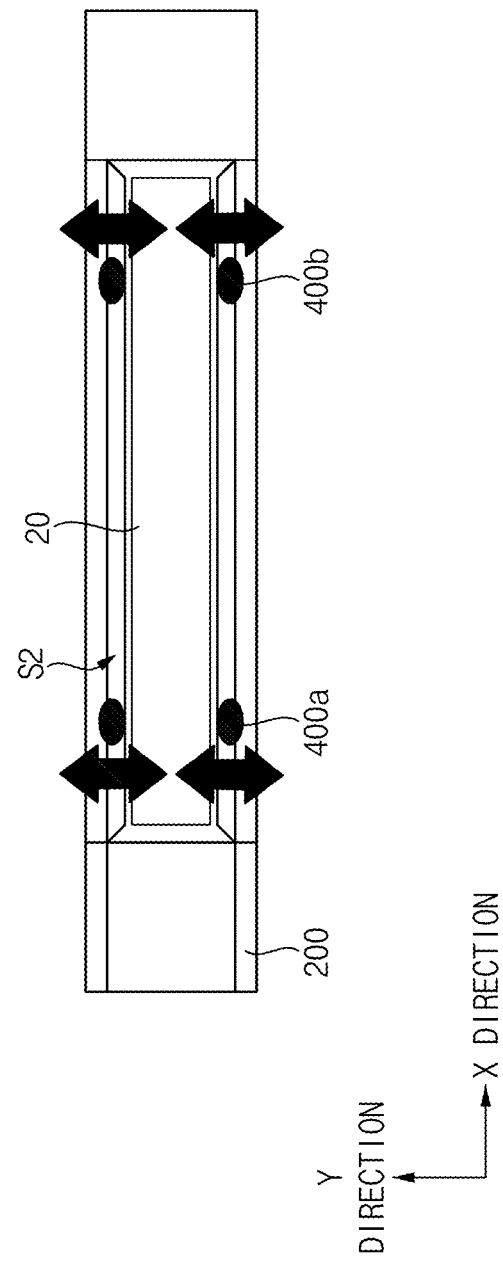

FIGS. 8 to 10 are front views illustrating processes in which a case and an insert block are separated and coupled. FIGS. 11 to 12 are plan views illustrating processes in which a case and an insert block are separated and coupled.

Referring to FIGS. 1 to 12, first, an insert block 200 may be disposed on a case 100, and a semiconductor substrate 20 may be disposed on the insert block 200. When the semiconductor substrate 20 is already accommodated in the insert block 200, the semiconductor substrate 20 may be inserted into the insert block 200 and the insert block 200 into which the semiconductor substrate 20 is inserted may be disposed on the case 100.

In some example embodiments, the insert block 200 may be inserted into and accommodated in an internal space S1 of the case 100 through an upper surface opening 114. The internal space S1 of the case 100 may be defined by a base plate 110, and first and second sidewalls 112a, 112b facing each other.

As illustrated in FIGS. 8 and 11, first and second fastening joints 220, 230 of the insert block 200 may be respectively engaged with first and second fastening grooves 122, 132 of the case 100. The first and second fastening joints 220, 230 may be respectively inserted into the first and second fastening grooves 122, 132. The first and second fastening grooves 122, 132 may restrict movement of the insert block 200 and may guide the insert block 200 into the internal space S1 of the case 100.

The insert block 200 may accommodate the semiconductor substrate 20 in the substrate accommodating space S2 through opening 214. The substrate accommodating space S2 of the insert block 200 may be defined by a bottom plate 210, a front plate 212a and a rear plate 212b facing each other, and first and second side plates 212c, 212d facing each other.

The semiconductor substrate 20 may be disposed on a plurality of side protrusions 400 provided on an inner surface of the insert block 200. The plurality of side protrusions 400a, 400b may support both sides of a lower surface of the semiconductor substrate 20, and may support the insert block 200 to maintain parallelism.

Then, an external force may be applied to the semiconductor substrate 20 disposed on the side protrusions 400 of the insert block 200 in a vertical direction (Z direction). The semiconductor substrate 20 may be inserted into the substrate accommodating space S2 of the insert block 200, and the insert block 200 may be inserted into the internal space S1 of the case 100.

In some example embodiments, the semiconductor substrate 20 may be disposed on the side protrusions 400 of the insert block 200. The side protrusions 400 may support the lower surface of the semiconductor substrate 20.

As illustrated in FIGS. 9 and 12, the external force F applied to an upper portion of the semiconductor substrate 20 may be transmitted to the insert block 200 through the side protrusions 400. The semiconductor substrate 20 may be inserted between the side protrusions 400 by the external force F, and both sides of the semiconductor substrate 20 may be fixed by the side protrusions 400. The side protrusions 400 may be compressed to the inner surface of the insert block 200 by the semiconductor substrate 20. The compressed side protrusions 400 may more strongly support the semiconductor substrate 20. For example, the external force F may be provided by an operator or a robot.

The external force F provided on the semiconductor substrate 20 may be transmitted to the case 100 through the insert block 200. The first and second fastening joints 220, 230 of the insert block 200 may be respectively inserted into the first and second fastening grooves 122, 132 by the external force F. The first and second fastening joints 220, 230 of the insert block 200 may contact the base plate 110 of the case 100 by the external force F. When the insert block 200 is completely inserted into the internal space S1 of the case 100, the semiconductor substrate 20 may be completely inserted into the substrate accommodating space S2 of the insert block 200. The semiconductor substrate 20 may be stored in the insert block 200 and the case 100.

Then, a tension T may be applied on the plurality of holders 300 provided on the first and second fastening joints 220, 230 of the insert block 200.

In some example embodiments, the tension T may be applied in the vertical direction (Z direction) to the holders 300 provided on the first and second fastening joints 220, 230. The insert block 200 may be withdrawn from the case 100.

As illustrated in FIG. 10, the tension T provided to the holders 300 may be transmitted to the case 100. The first and second fastening joints 220, 230 of the insert block 200 may be respectively separated from the first and second fastening grooves 122, 132 by the tension T. The case 100 may be fixed by an external device, a support, or the like in a process in which the insert block 200 is separated from the case 100. For example, the tension T may be provided by the operator or the robot.

The semiconductor substrate 20 provided in the substrate accommodating space S2 of the insert block 200 separated from the case 100 may be separated from the insert block 200, and the semiconductor substrate 20 may be safely stored and moved by the insert block 200 and the case 100.

As described above, the semiconductor substrate 20 may be accommodated in the case 100 while being inserted into the insert block 200. Since the first and second fastening joints 220, 230 of the insert block 200 are respectively inserted into and respectively coupled to the first and second fastening grooves 122, 132 of the case 100, the insert block 200 may be disposed at a desired (or alternatively, predetermined) position inside the case 100. Since the semiconductor substrate 20 is accommodated in the insert block 200, it is possible to prevent or hinder the semiconductor substrate 20 from being inserted into the case 100 at an incorrect position. In addition, since the semiconductor substrate 20 is doubly protected by the insert block 200 and the case 100, the semiconductor substrate 20 may be more stably protected and managed.

The foregoing is illustrative of some example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A module tray for a semiconductor device, comprising:
a case having a base plate, first and second sidewalls extending from opposite sides of the base plate in a vertical direction to define an accommodation space, and first and second fastening grooves respectively formed in inner surfaces of the first and second sidewalls and extending in the vertical direction, the first and second fastening grooves having upper ends opened to upper surfaces of the first and second sidewalls respectively; and
an insert block having a substrate accommodating space for accommodating a semiconductor substrate, the insert block detachably inserted into the first and second fastening grooves of the case, the insert block having first and second fastening joints extending in the vertical direction such that the first and second fastening joint are respectively inserted through the upper ends of the first and second fastening grooves.

2. The module tray of claim 1, wherein the insert block further includes a plurality of holders that extend in the vertical direction from an upper surface of the insert block.

3. The module tray of claim 2, wherein each of the plurality of holders extend in the vertical direction from an upper surface of one of the first and second fastening joints.

4. The module tray of claim 1, wherein
each of the first and second fastening joints includes an isosceles trapezium shape, and
each of the first and second fastening grooves includes a groove shape corresponding to the isosceles trapezium shape.

5. The module tray of claim 4, wherein a base angle of the isosceles trapezium shape is within a range of 45 degrees to 80 degrees.

6. The module tray of claim 4, wherein a length of a base of the isosceles trapezium shape is within a range of 4 mm to 6 mm.

7. The module tray of claim 1, wherein the insert block further includes a pair of side protrusions that protrude from respective first and second inner surfaces of the insert block facing each other and the pair of side protrusions are configured to press and fix the semiconductor substrate inserted into the substrate accommodating space.

8. The module tray of claim 7, wherein the side protrusions include an elastic material for elastically fixing the inserted semiconductor substrate.

9. The module tray of claim 7, further comprising the semiconductor substrate, wherein the semiconductor substrate includes a pair of grooves corresponding to the pair of side protrusions on each of upper and lower surfaces opposite to each other.

10. The module tray of claim 1, wherein the case includes a plurality of insert block support guides that respectively protrude in the vertical direction on the base plate to support a lower side of the insert block.

11. A module tray for a semiconductor device, comprising:
a case having a base plate, first and second sidewalls facing each other in a first horizontal direction on the base plate and defining an accommodation space, a plurality of first fastening grooves spaced apart from each other in a second horizontal direction orthogonal to the first horizontal direction on an inner surface of the first sidewall and respectively having first upper ends opened in a vertical direction, and a plurality of second fastening grooves spaced apart from each other in the second horizontal direction on an inner surface of the second sidewall and respectively having opened second upper ends; and
an insert block configured to accommodate a semiconductor substrate that is inserted therein, the insert block having first and second fastening joints that have shapes corresponding to the first and second fastening grooves such that the first and second fastening joints are respectively inserted into and engaged with the first and second fastening grooves in the vertical direction.

12. The module tray of claim 11, wherein the insert block further includes a plurality of holders that extend in the vertical direction from an upper surface of the insert block, the holders to transmit an external force for coupling or withdrawing the first and second fastening grooves and the first and second fastening joints.

13. The module tray of claim 12, wherein each of the plurality of holders extend in the vertical direction from an upper surface of one of the first and second fastening joints.

14. The module tray of claim 11, wherein
each of the first and second fastening joints includes an isosceles trapezium shape, and
each of the first and second fastening grooves includes a groove shape corresponding to the isosceles trapezium shape.

15. The module tray of claim 14, wherein a base angle of the isosceles trapezium shape is within a range of 45 degrees to 80 degrees.

16. The module tray of claim 14, wherein a length of a base of the isosceles trapezium shape is within a range of 4 mm to 6 mm.

17. The module tray of claim 11, wherein the insert block further includes a pair of side protrusions that protrude from respective first and second inner surfaces of the insert block facing each other, and the pair of side protrusions are configured to press and fix the semiconductor substrate inserted into a semiconductor substrate accommodating space of the insert block.

18. The module tray of claim 17, wherein the side protrusions include an elastic material for elastically fixing the inserted semiconductor substrate.

19. The module tray of claim 17, further comprising the semiconductor substrate, wherein the semiconductor substrate includes a pair of grooves corresponding to the pair of side protrusions on each of upper and lower surfaces opposite to each other.

20. A module tray for a semiconductor device, comprising:
- a case having a base plate, first and second sidewalls extending in a vertical direction from opposite sides of the base plate to define an accommodation space, and first and second fastening grooves formed to respectively extend in the vertical direction on inner surfaces of the first and second sidewalls, the first and second fastening grooves having upper ends respectively opened to upper surfaces of the first and second sidewalls; and
- an insert block having a substrate accommodating space for accommodating a semiconductor substrate, the insert block detachably inserted into the first and second fastening grooves of the case, the insert block having first and second fastening joints extending in the vertical direction such that the first and second fastening joint are respectively inserted through the upper ends of the first and second fastening grooves, each of a plurality of holders respectively extending in the vertical direction from one of the first and second fastening joints, and a pair of side protrusions configured to press and fix the semiconductor substrate inserted and accommodated into the substrate accommodating space.

* * * * *